United States Patent
Han et al.

(10) Patent No.: US 6,873,004 B1
(45) Date of Patent: Mar. 29, 2005

(54) VIRTUAL GROUND SINGLE TRANSISTOR MEMORY CELL, MEMORY ARRAY INCORPORATING SAME, AND METHOD OF OPERATION THEREOF

(75) Inventors: Kyung Joon Han, Palo Alto, CA (US); Steve K. Hsia, San Jose, CA (US); Joo Weon Park, Pleasanton, CA (US); Gyu-Wan Kwon, Cupertino, CA (US); Jong Seuk Lee, Palo Alto, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 149 days.

(21) Appl. No.: 10/358,645

(22) Filed: Feb. 4, 2003

Related U.S. Application Data
(60) Provisional application No. 60/354,911, filed on Feb. 4, 2002.

(51) Int. Cl.[7] ............................................. H01L 29/788
(52) U.S. Cl. ...................... 257/315; 257/E29.3; 257/6; 438/266; 438/286; 438/302; 438/525
(58) Field of Search ................... 257/E29.306; 438/266, 438/286, 302, 525

(56) References Cited

U.S. PATENT DOCUMENTS

| | | | |
|---|---|---|---|
| 5,060,195 A | 10/1991 | Gill et al. | |
| 5,418,741 A | 5/1995 | Gill | |
| 5,646,886 A | 7/1997 | Brahmbhatt | |
| 5,959,892 A | 9/1999 | Lin et al. | |
| 6,130,134 A | * 10/2000 | Chen | .......................... 438/302 |
| 6,175,519 B1 | 1/2001 | Lu et al. | |

* cited by examiner

Primary Examiner—David Nelms
Assistant Examiner—Mai-Huong Tran
(74) Attorney, Agent, or Firm—Altera Law Group, LLC

(57) ABSTRACT

An asymmetrical virtual ground single transistor floating gate memory cell has a floating gate that overlies a channel region in a p-well, the channel region lying between a heavily doped n+ drain region and a lightly doped n− source region. A heavily doped p+ region known as a "halo" is disposed in the channel adjacent the heavily doped n+ drain. The floating gate is spaced away from the channel region by a generally thin tunnel oxide. A lightly doped source with a graded source/channel junction reduces source side CHE generation. In one variation, a thicker oxide between the source and the floating gate reduces CHE injection from the source side. A heavily doped drain with a halo implant in the channel adjacent the drain enhances drain side CHE generation.

14 Claims, 10 Drawing Sheets

| MODE | MBL | | | WL | | SELECT GATE | | | | P WELL |
|---|---|---|---|---|---|---|---|---|---|---|
| | MBL 302 | MBL 304 | MBL 306 | MBL NEXT. | SELECT | NOT SELECT | SG1 | SG2 | SG3 | SG4 | |
| PROGRAM AT SECTOR ("1"/"0") | | | | | | | | | | | |
| STEP 1 (1361) | 4.5V / GND | 4.5V / 4.5V | 4.5V / GND | 4.5V / 4.5V | 10V | 0V | 6V | 0V | 6V | 0V | 0V |
| STEP 2 (1363) | 4.5V / GND | 4.5V / 4.5V | 4.5V / GND | 4.5V / 4.5V | 10V | 0V | 0V | 6V | 0V | 6V | 0V |
| STEP 3 (1362) | 4.5V / GND | 4.5V / 4.5V | 4.5V / GND | 4.5V / 4.5V | 10V | 0V | 0V | 6V | 6V | 0V | 0V |
| STEP 4 (1364) | 4.5V / GND | 4.5V / 4.5V | 4.5V / GND | 4.5V / 4.5V | 10V | 0V | 6V | 0V | 0V | 6V | 0V |
| ERASE AT BLOCK | 6V (FLOAT) | 6V (FLOAT) | 6V (FLOAT) | 6V (FLOAT) | -11V | -11V | 0V | 0V | 0V | 0V | 6V |
| READ AT CELL 1361 | 0V | 1.5V | 1.5V | 1.5V | 3V | 0V | 6V | 0V | 6V | 0V | 0V |

FIG. 15

VIRTUAL GROUND SINGLE TRANSISTOR MEMORY CELL, MEMORY ARRAY INCORPORATING SAME, AND METHOD OF OPERATION THEREOF

CROSS-REFERENCE TO RELATED APPLICATION

This application claims the benefit of U.S. Provisional patent Application No. 60/354,911, filed Feb. 4, 2002 (Han et al., "Virtual ground signal transistor memory cell, memory array incorporating same, and method of operation thereof," the entire disclosure of which is considered a part of this document and is hereby incorporated herein by reference thereto in its entirety.

BACKGROUND OF THE INVENTION

1. Field of the Invention

The present invention relates to semiconductor memory, and more particularly to a memory device structure for a virtual ground memory array.

2. Description of the Related Art

Nonvolatile memory retains stored data when power is removed, which is required or at least highly desirable in many different types of computers and other electronic devices. Nonvolatile semiconductor memory devices are generally divided into two main classes. The first class is based on the storage of charge in discrete trapping centers of a dielectric layer of the structure. The second class is based on the storage of charge on a conducting or semiconducting layer that is completely surrounded by a dielectric, typically an oxide.

A common type of stored charge device is the stacked gate transistor, also known as a floating gate transistor, in which cell programming is performed through channel hot-electron injection ("CHE"). An illustrative self-aligned double-polysilicon stacked gate structure 1 is shown in FIG. 1. A floating gate 14, typically a doped polysilicon layer, is sandwiched between two insulator layers 12 and 16, typically oxide. The top layer of the stack is a control gate electrode 10, typically a doped polysilicon layer. The stacked gate structure is shown symmetrically overlying a heavily doped n+ source region 20 and a heavily doped n+ drain region 22, as well as a channel region between the source region 20 and the drain region 22. The channel region is part of a p-well 28, which also contains the source region 20, the drain region 22, and a heavily p+ doped contact region 24. The p-well 28 is contained within an n-well 30, which also contains a heavily n+ doped contact region 26. The n-well 30 is in turn contained in the p-type substrate 32. When high voltages are applied simultaneously to the both the drain 22 and the gate 10 of cell of FIG. 1, the high voltage across the drain-to-source produces a high channel current and channel field that generate hot electrons in a pinch off region near the drain 22 (as indicated by wedge-shaped region and the notation e-). The high voltage on the control gate 10 couples a voltage to the floating gate 14 that attracts the hot electrons, effectively injecting them into the floating gate (as indicated by the upward-turned arrows adjacent the e- notation).

The self-aligned double-polysilicon stacked gate structure 1 shown in FIG. 1 has been used in a contactless configuration to achieve high memory density levels. FIG. 2 is a schematic diagram showing a basic virtual ground array architecture 100 that uses a cross-point array configuration defined by continuous buried n+ diffusions that form the bitlines or columns, illustratively $C_{+2}$, $C_{+1}$, $C_0$ and $C_{-1}$ in FIG. 2, and WSi$_2$/Poly control gate wordlines or rows, illustratively $R_{+1}$, $R_0$ and $R_{-1}$ in FIG. 2. Metal is used to contact the bit line periodically, for example every sixteenth word line, to reduce bit line resistance. Due to elimination of the common ground line and the drain contact in each memory cell, extremely small cell size is realized. Programming, erasing and reading of the memory cells is obtained by the use of asymmetrical floating gate transistors or on suitable source and drain decoding. A great many virtual ground array architectures and nonvolatile semiconductor memory devices have been developed, as exemplified by the following patents: U.S. Pat. No. 6,175,519, issued Jan. 16, 2001 to Liu et al.; U.S. Pat. No. 5,959,892, issued Sep. 28, 1999 to Lin et al.; U.S. Pat. No. 5,646,886, issued Jul. 8, 1997 to Brahmbhatt; and U.S. Pat. No. 5,060,195, issued Oct. 22, 1991 to Gill et al.

Examples of one type of asymmetrical floating gate transistor and of a virtual ground memory array incorporating it are disclosed in U.S. Pat. No. 5,418,741, issued May 23, 1995 to Gill. Each shared column line has two junctions for each pair of memory transistors that share the column line. One junction is graded for source regions and the other is graded for drain regions. The deep source regions are graded, i.e. gradually sloped, to minimize programming at the source junction region, while the relatively shallow drain regions are abrupt, i.e. steeply sloped, to improve the injection efficiency of the device. The bit line is formed by the shallow drain region implant, which is an n+ implant. Due to the different junction characteristics of adjacent cells, the programming of one cell is said not to disturb the state of the immediately adjacent cell.

Even with the use of asymmetrical floating gate transistors, the programming of cells in the array using CHE requires careful biasing schemes on the bit lines to reduce the disturb voltage on an adjacent cell sharing the same bit line. Generally, CHE programming of a floating gate transistor is achieved by applying high positive voltages on both the control gate and the drain, so that both the vertical and lateral components of the electric field are high enough to make efficient CHE injection. The use of an abrupt drain junction and the higher drain voltage improved the efficiency of electron injection, and the use of thin tunnel oxide and high control gate bias is effective for attracting hot electrons to the floating gate. Nonetheless, further improvements in asymmetrical floating gate transistor structure is desirable so that schemes for counter-biasing the bit lines may be simplified.

BRIEF SUMMARY OF THE INVENTION

Unfortunately, the asymmetrical floating gate transistor of Gill uses a thermal insulator region 24 that is grown over the arsenic implant used both for the n+abrupt-junction doping and for the n+bit line doping. The growth of the thermal insulator region 24 subsequent to the n+doping is, we believe, disadvantageous. As the thermal oxide is grown, the arsenic implant both diffuses and is consumed by the growing oxide, which can adversely affect the doping concentration and other characteristics of the bit line and the abrupt junction.

Alternatively or in addition, the degree of asymmetry between the source and drain junction characteristics in the prior art may not be as great as desired, and further improvements therein can further simplify schemes for counter-biasing the bit lines.

We have developed a floating gate transistor for a memory array having enhanced CHE generation on the drain side and, in the alternative or in addition, reduced CHE generation on the source side. This structure enables less complex counter-biasing schemes to be used on the bit lines, relative to the schemes required for some conventional virtual ground architecture cell arrays.

We have further developed a memory array having heavily doped column lines, which function as embedded bit lines and which also serve as source regions for floating gate transistors. The heavily doped column lines advantageously are unaffected by any isolation structures where they are in proximity to the floating gate transistors.

The disadvantages described above and other disadvantages are overcome individually or collectively in various embodiments of the present invention. One embodiment of the present invention is a single-transistor virtual ground memory cell comprising a semiconductor substrate, a control gate, a floating gate disposed under the control gate and separated therefrom by a dielectric, a first relatively lightly doped region disposed in the semiconductor substrate and comprising a source region, a first relatively heavily doped region disposed in the semiconductor substrate and comprising a drain region, and a channel region disposed in the semiconductor substrate under the floating gate and separated therefrom by a tunnel dielectric, the channel region being disposed between the source region and the drain region. The first relatively lightly doped region is merged with a second relatively heavily doped region disposed in the substrate, and the first relatively heavily doped region is merged with a second relatively lightly doped region in the substrate. The merged first relatively lightly doped region and second relatively heavily doped region are not contiguous with an overlying thermal oxide in proximity to the source region. The merged first relatively heavily doped region and second relatively lightly doped region are not contiguous with an overlying thermal oxide in proximity to the drain region.

Another embodiment of the present invention is a semiconductor memory array block comprising a semiconductor substrate, a plurality of row lines, a plurality of column lines, and a plurality of single floating gate transistor memory cells respectively disposed along the row lines between cross points of the row and column lines. Each of the transistors has asymmetrical source and drain regions of a first doping type and a channel therebetween of a second doping type different than the first doping type, the source region forming a junction with the channel for reduced channel hot electron generation and the drain region forming a junction with the channel for enhanced channel hot electron generation. Each of the column lines comprises a relatively heavily doped continuous longitudinal region of the first doping type in the semiconductor substrate, sections of which form the drain regions of the transistors and are not contiguous with any overlying thermal oxide. Each of the column lines further comprises a plurality of relatively lightly doped regions of the first doping type in the semiconductor substrate, the plurality of relatively lightly doped regions being merged with the relatively heavily doped continuous longitudinal region, forming the source regions of the transistors, and not being contiguous with any overlying thermal oxide.

Yet another embodiment of the invention is a method for forming a semiconductor memory array block comprising defining active areas in a substrate; forming tunnel oxide over the active areas; forming a plurality of polysilicon floating gates over the tunnel oxide; forming a source implant mask; implanting a first dopant into the semiconductor substrate with use of part of each of the floating gates as mask features and the source implant mask to form lightly doped source regions; forming a drain implant mask; implanting a second dopant into the semiconductor substrate with use of part of each of the floating gates as mask features and the drain implant mask to form heavily doped drain regions and a plurality of column lines, a plurality of channels being disposed between respective ones of the source and drain regions and under respective ones of the floating gates; depositing an oxide film layer by chemical vapor deposition over the column lines; and forming a plurality of polysilicon row lines over respective groups of the floating gates.

BRIEF DESCRIPTION OF THE SEVERAL VIEWS OF THE DRAWINGS

FIG. 15 is a table of voltages suitable for operating a virtual ground memory array having single transistor memory cells like that of FIG. 3.

DETAILED DESCRIPTION OF THE INVENTION, INCLUDING THE BEST MODE

Figure 3:
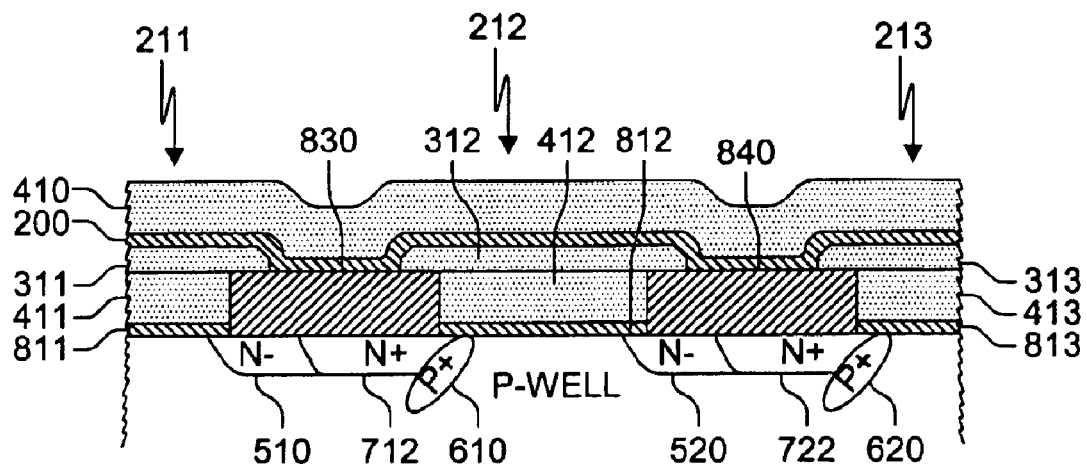
FIG. 3 is a cross-section view of a virtual ground memory array structure showing one embodiment of a single transistor memory cell in accordance with the present invention.

FIG. 3 is a cross-section view of three virtual ground single transistor memory cells 211, 212 and 213 that under suitable operating conditions provides enhanced CHE generation on their drain sides and suppressed CHE generation on their source sides. The transistors 211 and 213 are shown partially and the transistor 212 is shown fully. With reference to transistor 212, a control gate 410 is space from an upper section 312 of a stacked floating gate by a interpoly oxide 200. A lower section 412 of the stacked floating gate is spaced from a channel region by an ultra-thin tunnel oxide 506. The channel region is defined in a p-well on one side by a heavily doped n+ region 712 which is considered to be the drain, and on the other side by a lightly doped n− region 720 which is considered to be the source. A heavily doped p+ region 610 known as a "halo implant" is used in the channel adjacent the heavily doped n+ drain 712 to enhance the generation of channel hot electrons as well as to reduce punch-through leakage. The gradually sloped source/channel junction of the lightly doped n− source region 720 tends to minimize channel hot electron ("CHE") generation near the channel/source junction. The abruptly sloped drain/channel junction of the heavily doped n+ drain region 712 and the p+ doped halo region 610 enhances CHE on the drain side. Transistors 211 and 213 are similar to the transistor 212. Transistor 211 has a stacked floating gate formed by lower section 411 and upper section 311. The lower section 411 is spaced away from the channel by the tunnel oxide 506, and the upper section 311 is spaced away from the control gate 410 by the interpoly oxide 200. The source for the transistor 211 is the n− region 710. Transistor 213 has a stacked floating gate formed by lower section 413 and upper section 313. The lower section 413 is spaced away from the channel by the tunnel oxide 506, and the upper section 313 is spaced away from the control gate 410 by the interpoly oxide 200. The drain for the transistor 213 is the n+ region 722. The p+ doped halo region 620 for the transistor 213 is also shown.

When used in a virtual ground memory array architecture, the source and drain regions of adjacent cells lie along a common bit line. For example, as shown in FIG. 3, one such bit line (the term "bit line" is inclusive of any line that carries information represented by varying voltage or current levels, including sub-bit lines) is formed by the n+ drain region 712 and the n− source region 710. Another such bit line is formed by the n+ drain region 722 and the n− source region 720. While the n+ drain regions along any particular bit line preferably are formed as a continuous line to maintain a uniformly low resistivity along the line, the n− source regions along the same particular bit line may be formed as a continuous line or as discrete regions merged with the n+ line.

These characteristics are useful when the single transistor memory cells 211, 212 and 213 are employed in a virtual ground memory array architecture, since they permit less complex counter-biasing schemes on the bit lines.

Figure 5:
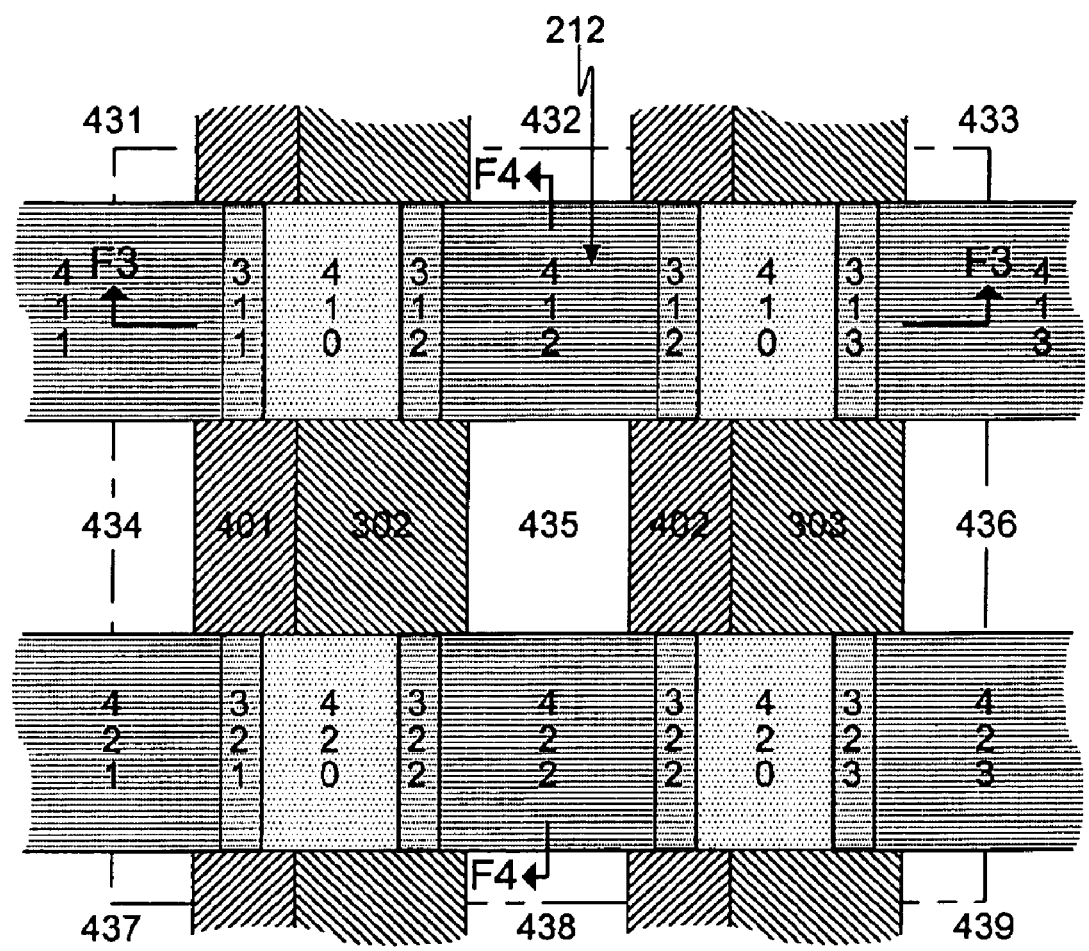
FIG. 5 is a top plan view of an embodiment of a virtual ground memory array structure virtual that includes single transistor memory cells in accordance with the present invention, of which the section along line F3—F3 is shown in FIG. 3, and the section along line F4—F4 is shown in FIG. 4.

The virtual ground single transistor memory cells of FIG. 3 are shown in a top plan view in FIG. 5, which also shows some other single transistor memory cells of the memory array. FIG. 3 is a cross-section of the single transistor memory cells along section line F3—F3. Three single transistor memory cells are shown along polysilicon word line 410 and have respective stacked floating gates formed by lower polysilicon sections 411, 412 and 413 and upper polysilicon sections 311, 312 and 313. The three single transistor memory cells arranged along polysilicon word line 420 have respective stacked floating gates formed by lower polysilicon sections 421, 422 and 423 and upper polysilicon sections 321, 322 and 323. Field isolation regions 431–439 separate the channels of adjacent single transistor memory cells.

Figure 4:
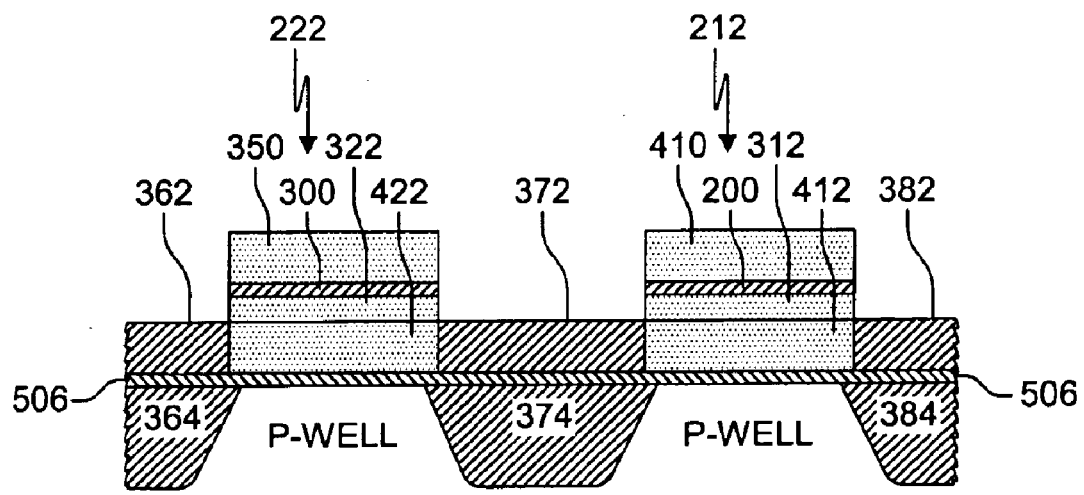
FIG. 4 is a cross-section view through another part of the virtual ground memory array structure of FIG. 3.

FIG. 4 shows a cross-section of the single transistor memory cells along section line F4—F4 in FIG. 5. The transistor 212 is seen with the control gate 410, the interpoly oxide 200, the stacked floating gate upper section 312 and lower section 412, and the tunnel oxide 506. A transistor 222, which shares the same bit line, is seen with a control gate 350, an oxide 300, a stacked floating gate having upper section 322 and lower section 422, and the tunnel oxide 506. Field isolation structures are also shown, here illustrative shallow oxide-filled trenches 364, 374 and 384.

FIGS. 6–9 and FIG. 3 show various stages in the fabrication of the virtual ground memory cell array shown in FIG. 5, in accordance with one illustrative process sequence. It will be appreciated that all materials, dimensions, doping concentrations, doses, energy levels, temperatures, drive-in times, ambient conditions, and all other values for the parameters of the process sequence are described only as examples, and that different values may well be selected as a matter of design choice to one of ordinary skill in the art, or otherwise selected to achieve desired characteristics. It will also be appreciated that some additional process operations may be performed to create transistors and other devices peripheral to the memory array and to form contacts and metal lines and to protect and pacify the integrated circuit. As these operations are not specific to the fabrication of the virtual ground memory cell and are in any event well known in the art, they are not further described herein.

For the illustrative fabrication process, the starting material is a p-type silicon substrate. On the p-type substrate material, a pad oxide layer and silicon nitride layer are deposited and patterned in a manner well known in the art. The field areas are exposed by plasma etching in a manner well known in the art, and shallow trench isolation ("STI") is formed between the active area in a manner well known in the art. Isolation wells (n-well and p-well) are formed in the active areas in a manner well known in the art.

Figure 6:
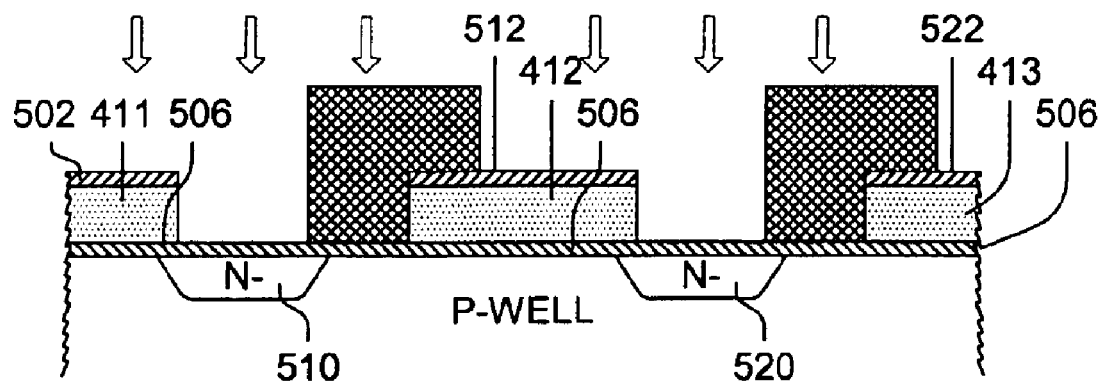
FIG. 6 is a cross-section view of the virtual ground single transistor memory cells of FIG. 3 in an early stage of fabrication.

As shown in FIG. 6, a layer 506 of tunnel oxide is grown in the active areas to a thickness of about 90 Å to about 100 Å in a manner well known in the art. The tunnel oxide layer 506 may be grown, for example, by dry oxidation at atmospheric pressure and relatively low temperature, dry oxidation with HCl, oxidation at reduced total pressures, oxidation at reduced partial pressures of $O_2$, use of composite oxide films such as oxynitrides, and so forth. Next, a polysilicon film of about 1500 Å is deposited over the tunnel oxide layer 506 in a manner well known in the art. The polysilicon layer may be formed, for example, by chemical vapor deposition ("CVD") and is lightly phosphorus doped to establish a resistivity of about 4000 to 6000 ohms per square. Next, a thin layer of thermal oxide having a thickness of about 500 Å and a covering silicon nitride layer are deposited in a manner well known in the art. The nitride/oxide layer is patterned using plasma etching in a manner well known in the art to form a floating gate mask having oxynitride features such as 502, 512 and 522. The polysilicon layer then is etched by plasma etching in a manner well known in the art to form floating gates such as 411, 412 and 413. The tunnel oxide layer 506 is left in place. An n− source implant then is performed through the tunnel oxide layer 506 in a manner well known in the art using Phosphorous at a dose of about $3 \times 10^{14}$ $cm^{-2}$ and an energy of about 30 KeV.

The implant is driven in under suitable conditions as is well known in the art to form n− regions such as 510 and 520 from which source regions will result.

Figure 7:
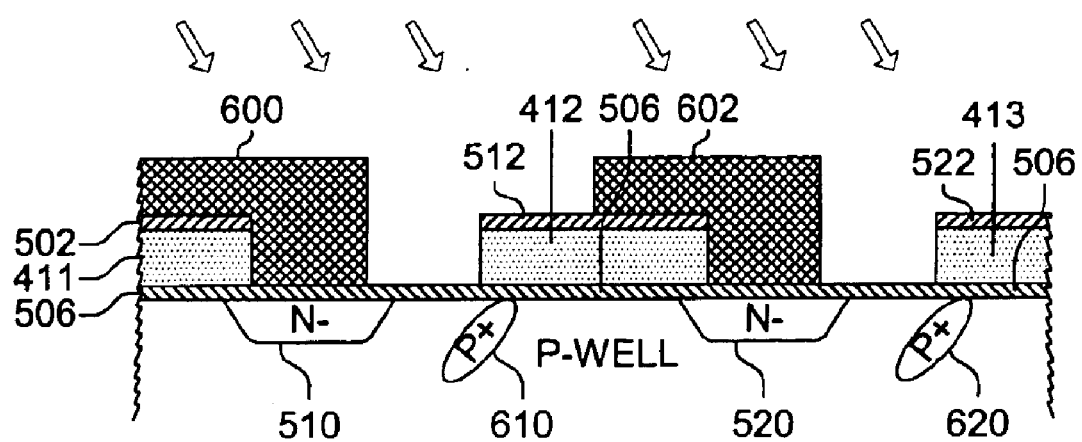
FIG. 7 is a cross-section view of the virtual ground single transistor memory cells of FIG. 3 in a stage of fabrication subsequent to that of FIG. 6.

Next as shown in FIG. 7, a photoresist layer is deposited and patterned in a manner well known in the art to form an implant mask having masking features such as 600 and 602. Then, a halo implant is made into the drain side. The implant is a Boron p-type implant at a dose of about $5\times10^{13}$ cm$^{-2}$, an energy of about 30 KeV, and a tilt angle of about 30 degrees. Subsequent thermal steps activate the implant is well known in the art to form p+ halo implant regions such as 610 and 620.

Figure 8:
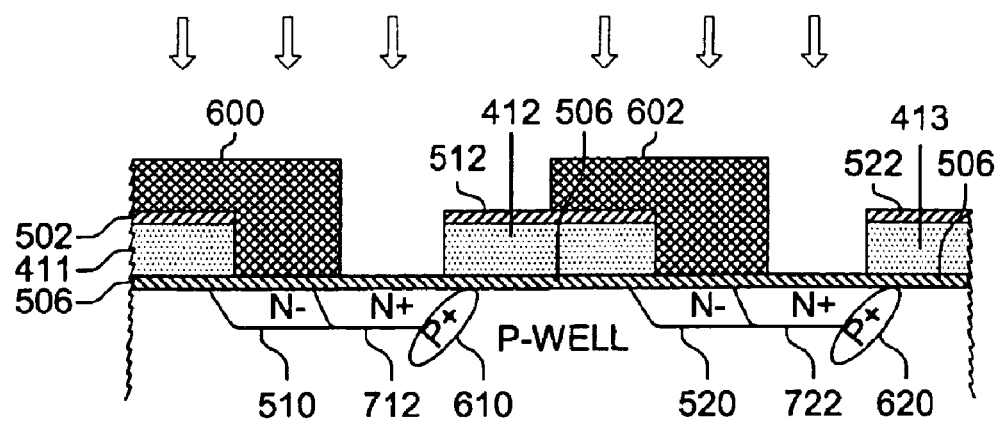
FIG. 8 is a cross-section view of the virtual ground single transistor memory cells of FIG. 3 in a stage of fabrication subsequent to that of FIG. 7.

Next as shown in FIG. 8, an n+ drain implant is performed through the tunnel oxide layer 506 in a manner well known in the art using Arsenic at a dose of about $4\times10^{15}$ cm$^{-2}$, an energy of about 40 KeV, and a tilt angle of about 7 degrees. Subsequent thermal steps activate the implant is well known in the art to form n+ drain regions such as 712 and 722 respectively contiguous with p+ halo implant regions such as 610 and 620, without disturbing the n− source regions such as 510 and 520. It will be appreciated that the source region 510 and the drain region 712 are part of one bit line, while the source region 520 and the drain region 722 are part of another bit line. In preparation for subsequent process steps, the photoresist masking features such as 600 and 602 are removed using a wet strip in a manner well known in the art. If desired, sidewall oxide (not shown) may be formed on the sidewalls of the floating gates 411, 412 and 413 by oxidation under any suitable conditions, such as, for example, in an $O_2$ ambient at about 900 degrees Centigrade for about 8–16 minutes. This sidewall oxide helps improve data retention.

Figure 9:
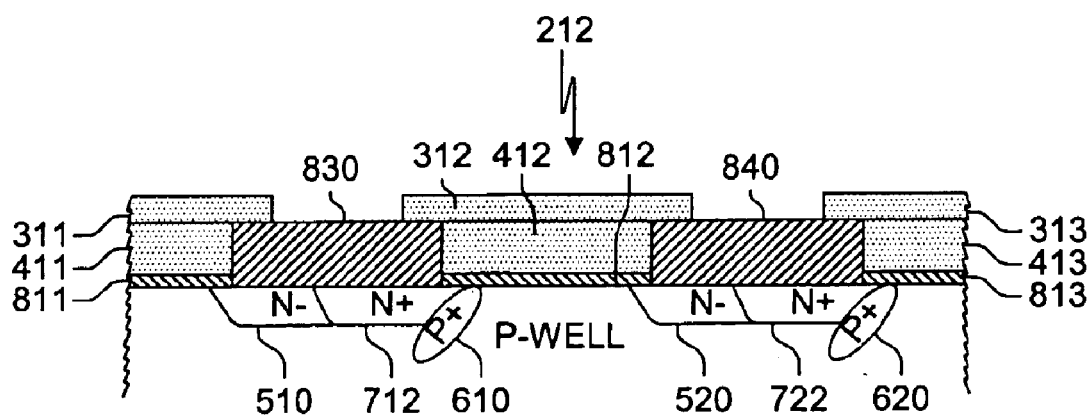
FIG. 9 is a cross-section view of the virtual ground single transistor memory cells of FIG. 3 in a stage of fabrication subsequent to that of FIG. 8.

Next as shown in FIG. 9, a plasma etch is then performed in a manner well known in the art to remove the oxynitride features such as 502, 512 and 522 and expose the tops of the polysilicon floating gates 411, 412 and 413. The plasma etch also removes portions of the tunnel oxide layer 506 that are not protected by the floating gates, resulting in tunnel oxide structures such as 811, 812 and 813. A thick chemical vapor deposited oxide film layer is deposited and densified in a manner well known in the art, and also serves to anneal and drive-in the halo and drain implants. The chemical vapor deposited oxide film then is planarized using mechanical chemical polishing, in a manner well known in the art. The resulting planarized structure is etched using plasma etching in a manner well known in the art to expose the tops of the polysilicon floating gates such as 504, 514 and 524, and a thin polysilicon film of about 500 Å is deposited in a manner well known in the art. The polysilicon film may be formed, for example, by chemical vapor deposition ("CVD") and is lightly phosphorus doped to establish a resistivity of about 4000 to 6000 ohms per square. A resist mask for defining stacked floating gate upper sections is formed over the polysilicon layer, which is subsequently etched by plasma etching in a manner well known in the art to form stacked floating gate upper sections such as 311, 312 and 313. The stacked floating gate upper sections 311, 312 and 313, which are also known as polysilicon wings, function to improve capacitive coupling between the floating gate and the control gate.

Next as shown in FIG. 3, an interpoly oxide-nitride-oxide layer 200 having any suitable thickness, illustratively about 140 Å to 160 Å, is deposited in a manner well known in the art, and a polycide (tungsten or cobalt silicide) layer 410 of any suitable thickness is deposited in a manner well known in the art. The layers 410 and 200 are defined using a suitable mask and plasma etching in a manner well known in the art to form word lines that include control gate sections, and the etching is continued through second and first polysilicon layers to complete definition of the stacked floating gates. The upper stacked floating gate sections such as 311, 312, 313 and 322 and the lower stacked floating gate sections such as 411, 412, 413 and 422 have two opposite edges that are self-aligned with the control gates 410 and 350 (see FIG. 4).

The integrated circuit is completed with subsequent process operations to form various additional layers of insulation, contacts, metal lines, and protective overcoats, in a manner well known in the art. Other process operations may be added to improve various aspects of the integrated circuit. As these operations are not specific to the fabrication of the virtual ground memory cell and are in any event well known in the art, they are not further described herein.

Figure 10:
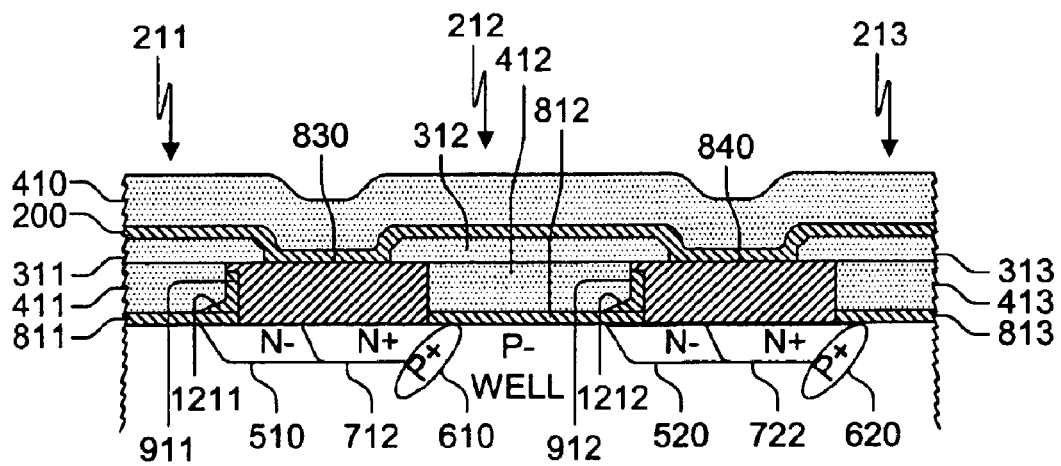
FIG. 10 is a cross-section view of a virtual ground memory array structure showing another embodiment of a single transistor memory cell in accordance with the present invention.

A variation of the cell structure of FIG. 4 that further inhibits undesired source side channel hot electron injection is shown in cross section in FIG. 10, which corresponds to the section shown in FIG. 3. The single transistor floating gate cell of FIG. 10 is essentially identical to the single transistor floating gate cell of FIG. 3 except for regions of thickened oxide such as 1211 and 1212 formed above the ultra-thin tunnel oxide 811 and 812 and overlying the lightly doped n− source regions 510 and 520. The presence of the thicker oxide 1211 and 1212 further inhibits undesired source side channel hot electron injection, especially in combination with the graded channel/source junction. The absence of the thickened oxide overlying the source is favorable for drain side channel hot electron injection.

Figure 11:
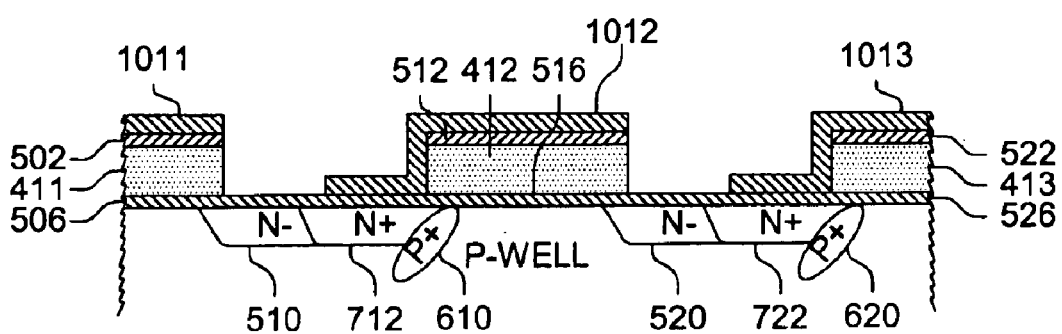
FIG. 11 is a cross-section view of the virtual ground single transistor memory cells of FIG. 10 in a supplemental stage of fabrication subsequent to that of FIG. 8.
Figure 12:
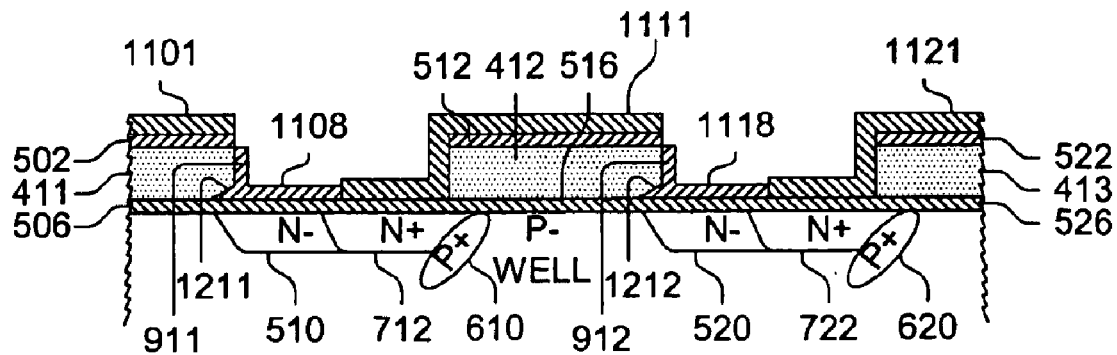
FIG. 12 is a cross-section view of the virtual ground single transistor memory cells of FIG. 10 in a stage of fabrication subsequent to that of FIG. 11.
Figure 13:
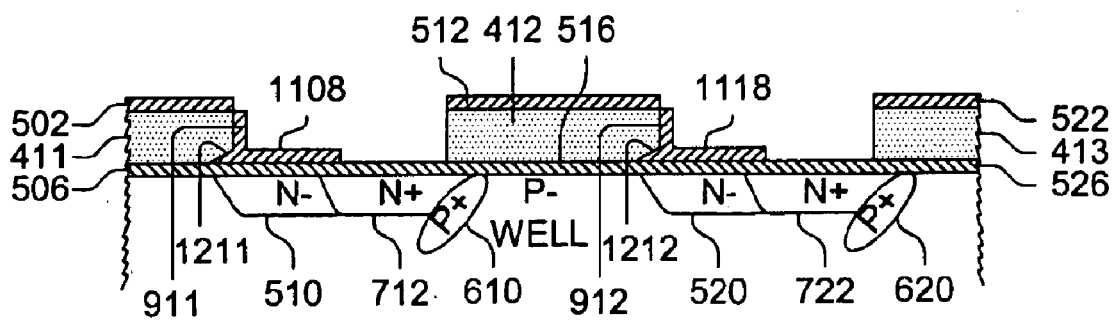
FIG. 13 is a cross-section view of the virtual ground single transistor memory cells of FIG. 10 in a stage of fabrication subsequent to that of FIG. 12.

FIGS. 11–13 show optional illustrative process operations that can be incorporated into the process sequence shown in FIGS. 6–9 and FIG. 3 after the source implant operation (FIG. 8) to obtain the cell structure shown in FIG. 10. As is so for the process operations of FIGS. 6–9 and FIG. 3, all materials, dimensions, doping concentrations, doses, energy levels, temperatures, drive-in times, ambient conditions, and all other values for the parameters of the process sequence are described only as examples, and that different values may well be selected as a matter of design choice to one of ordinary skill in the art, or otherwise selected to achieve desired characteristics.

After the halo implant step (FIG. 7) and the source implant step (FIG. 8) and as shown in FIG. 11, a silicon nitride layer of about 1 micron is deposited in a manner well known in the art, and is patterned in a manner well known in the art and etched using plasma etching to form a source-side oxidation mask having features such as 1011, 1012 and 1013.

As shown in FIG. 12, the wafer next is oxidized in an $O_2$ ambient at about 900 degrees Centigrade for about 8–16 minutes, which results in the growth of relatively thin oxide structures such as 1111 and 1112 along the sidewalls of the floating gates 411 and 412 and over some parts of the n+ doped regions 510 and 520. In addition, some oxide encroachment 1211 and 1212 occurs between the floating gates 411 and 412 and the n− regions 510 and 520. The oxide encroachment 1211 and 1212 remain in the finished cell and inhibits injection of any channel hot electrons generated despite the graded channel/source junction profile. It will be appreciated that if sidewalls are formed for data retention purposes as described above in the context of FIG. 8, the oxidation step of FIG. 12 is in addition to the sidewall oxidation step. However, because the source side is protected by the source-side oxidation mask having features such as 1101, 1012 and 1013, no further oxide encroachment occurs between the floating gates 412 and 413 and the n+ regions 712 and 722.

As shown in FIG. 13, the silicon nitride features 1011, 1012 and 1013 are removed by plasma etching in a manner well known in the art, leaving behind the oxide structures 1111 and 1112. Processing proceeds with the operations described with reference to FIG. 9, except that the sidewall portions 911 and 912 and the encroachments 1211 and 1212 (FIG. 10) survive intact.

Figure 1:
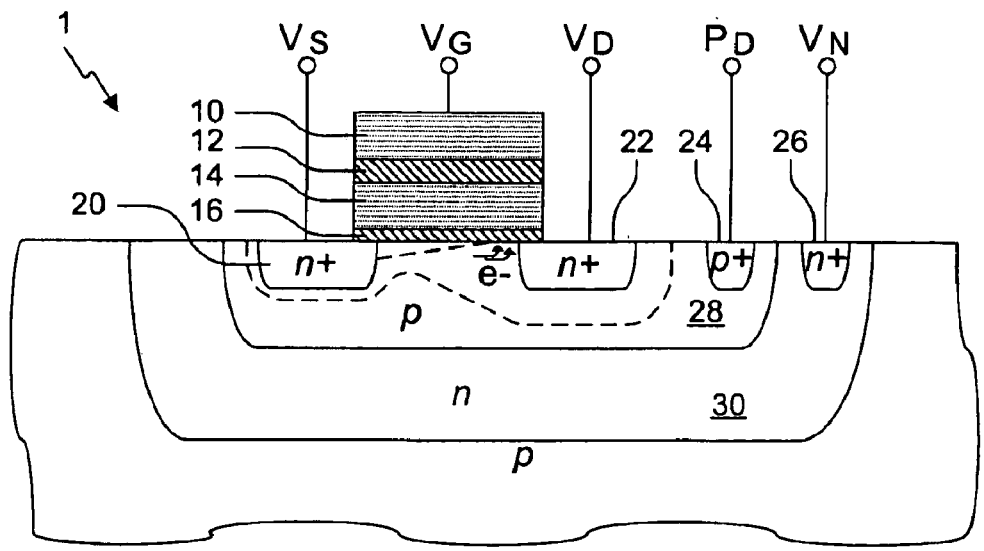
FIG. 1 is a cross-section drawing of a stacked gate memory cell of the prior art.
Figure 2:
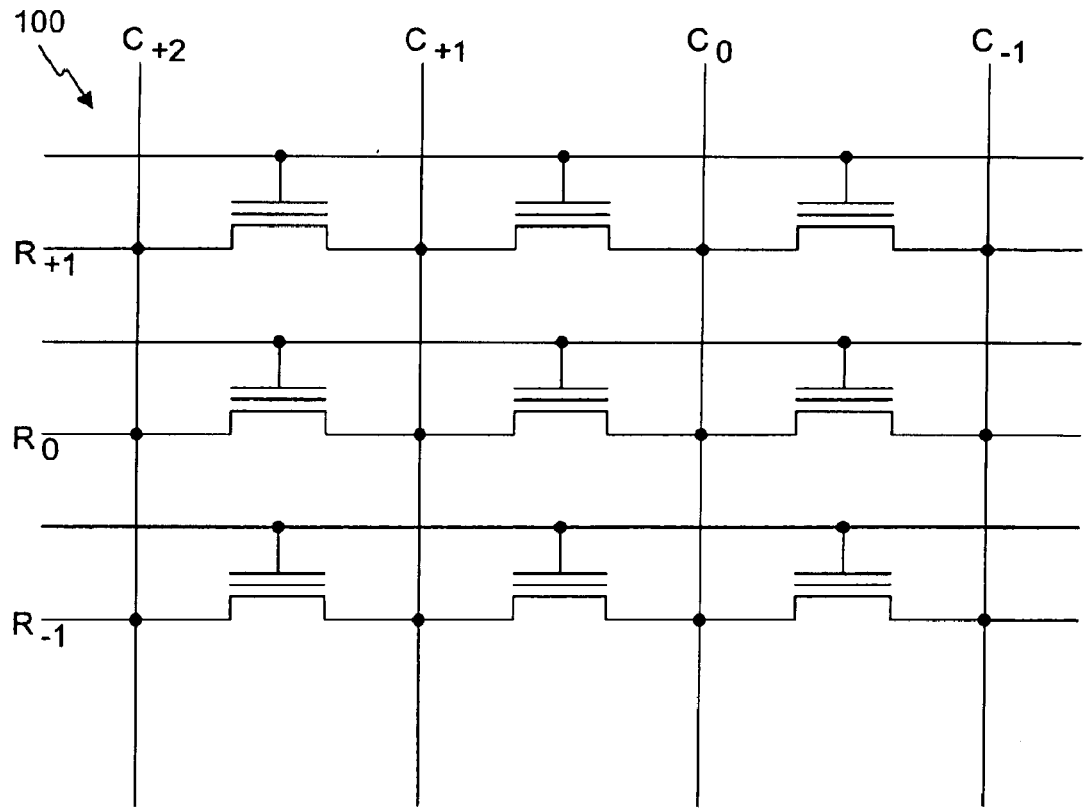
FIG. 2 is a schematic diagram of a virtual ground array of stacked gate memory cells of the prior art.
Figure 14:
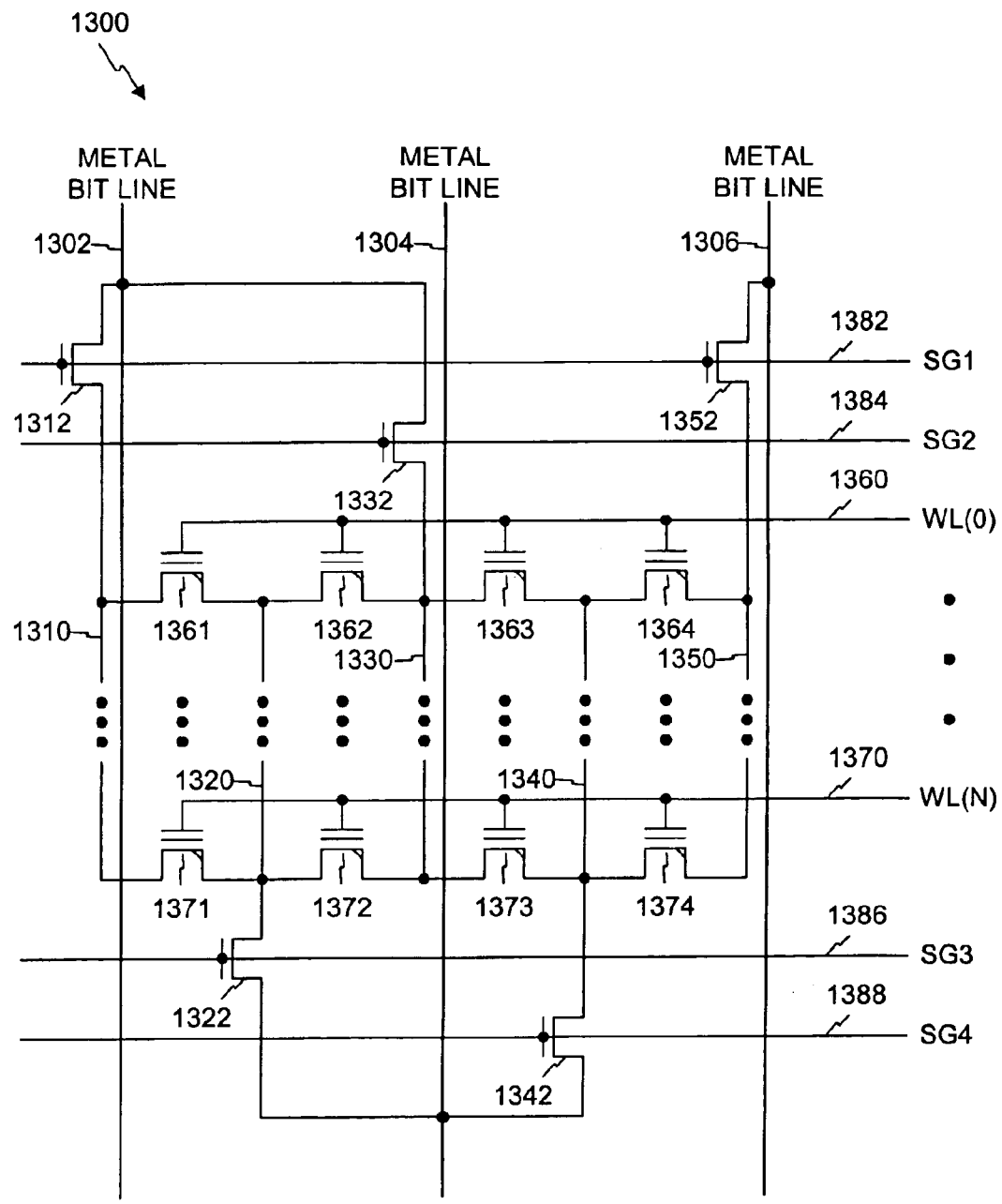
FIG. 14 is a schematic circuit diagram of another virtual ground memory array for which single transistor memory cells like that of FIG. 3 and FIG. 10 are suitable.

FIG. 14 shows another type of virtual ground memory array 1300 in which memory cells of FIG. 3 or FIG. 10 may be used. FIG. 15 shows an illustrative set of voltages for operating the memory cells of FIG. 3 or FIG. 10 in a virtual ground memory array architecture such as 1300 (FIG. 14) or in the virtual ground memory array architecture 200 (FIG. 2). It will be appreciated that the memory arrays 200 and 1300 and the voltages shown in FIG. 15 are only examples of suitable virtual ground memory array architectures and suitable operating voltages, and the virtual ground memory cell of FIG. 3 and FIG. 10 may be used in other different types of virtual ground memory arrays, and/or with different voltages. As shown in FIG. 14, word line 1360 controls four single transistor cells 1361–1364, and word line 1370 controls four single transistor cells 1371–1374 (only four cells per word line are shown for clarity, since in practice many more cells would be controlled by a single word line). The drain side of each of the transistors 1361–1364 and 1371–1374 is indicated by a small triangle, which is suggestive of the abrupt junction or the halo implant. Three bit lines 1302, 1304 and 1306 are shown, and five sub-bit lines 1310, 1320, 1330, 1340 and 1350 are shown. Illustratively, the bit lines 1302, 1304 and 1306 are metal, and the sub-bit lines 1310, 1320, 1330, 1340 and 1350 are embedded n+ doped lines. Voltages on the bit line 1302 are selectively steered to either sub-bit line 1310 or sub-bit line 1330 by transistor 1312 under control of select gate voltage SG1 on line 1382 and transistor 1332 under control of select gate voltage SG2 on line 1384. Voltages on the bit line 1304 are selectively steered to either sub-bit line 1320 or sub-bit line 1340 by transistor 1322 under control of select gate voltage SG3 on line 1386 and transistor 1342 under control of select gate voltage SG4 on line 1388. Voltages on the bit line 1306 are selectively steered to either sub-bit line 1350 or to another sub-bit line (not shown) by transistor 1352 under control of select gate voltage SG1 on line 1382 and another transistor (not shown) under control of select gate voltage SG2 on line 1384.

Blocks of cells are erased to a low $V_T$ or "1" state by bringing the bit lines 302, 304 and 306 to a particular voltage value, for example 6 volts, or floating them. The steering transistors 1312, 1322, 1332, 1342 and 1352 are all turned off by applying 0 volts to their gates over their respective control lines, so that the sources and drains of the transistors 1361–1364 and 1371–1374 are all floating. When the P well is brought to 6 volts and the word lines 1360 and 1370 are brought to −11 volts, the transistors 1361–1364 and 1371–1374 are all erased to a low VT state by Fowler-Nordheim tunneling of electrons from the floating gates of the transistors to the substrate.

One or more cells on a word line are programmed to a high $V_T$ or "0" state as follows. Say one wishes to program cell 1361. Alternate bit lines are brought to ground and 4.5 volts respectively; for example, bit lines 302 and 1306 are brought to ground while bit line 304 is brought to 4.5 volts. Word line 1360 is raised to 10 volts, while the other word lines in the block, illustratively word line 1370, are brought to 0 volts. Zero volts is steered to the source of transistor 1361 by placing 6 volts on the gate of transistor 1312, while 4.5 volts is steered to the drain of transistor 1361 by placing 6 volts on the gate of transistor 1322. Hot electrons are generated in transistor 1361 and are attracted to the floating gate of the transistor due to the 10 volt potential on its control gate, so that the transistor 1361 acquires a high $V_T$ state. Transistors 1362–1364 do not program because one or both of their sources and drains are floating. Transistors 1371–1374 do not program because their control gates are at 0 volts.

The other transistors 1362, 1363 and 1364 in the group of four are programmed successively in essentially the same way by varying the steering voltages. Transistor 1363 is programmed by applying 0 volts on SG1 line 1382, 6 volts on SG2 line 1384, 0 volts on SG3 line 1386, and 6 volts on SG4 line 1388. Transistor 1362 is programmed by applying 0 volts on SG1 line 1382, 6 volts on SG2 line 1384, 6 volts on SG3 line 1386, and 0 volts on SG4 line 1388. Transistor 1364 is programmed by applying 6 volts on SG1 line 1382, 0 volts on SG2 line 1384, 0 volts on SG3 line 1386, and 6 volts on SG4 line 1388.

Cells that are not to be programmed to a high $V_T$ state are left in an erased or low $V_T$ state by placing 4.5 volts on adjacent metal bit lines and steering this voltage to both the source and drain of the cells. For example, if transistor 1361 is to be left in an erased state, bit lines 1302 and 1304 are brought to 4.5 volts. When these voltages are steered to the transistor 1361, the source and drain are at the same potential and no hot electrons are generated.

Individual cells may be read as follows. If transistor 1361 is to be read, word line 1360 is brought to 3 volts, bit line 302 is brought to 0 volts, and bit lines 304 and 306 are brought to 1.5 volts. Zero volts is steered to the source of transistor 1361 by placing 6 volts on the gate of transistor 1312, while 1.5 volts is steered to the drain of transistor 1361 by placing 6 volts on the gate of transistor 1322. Current flows through transistor 1361 and on the bit line 1302 if transistor 1361 is in a low $V_T$ state, while no current flows through transistor 1361 and on the bit line 1302 if transistor 1361 is in a high $V_T$ state. The logical state of the transistor 1361 is determined by sensing the current flow.

Figure 16:
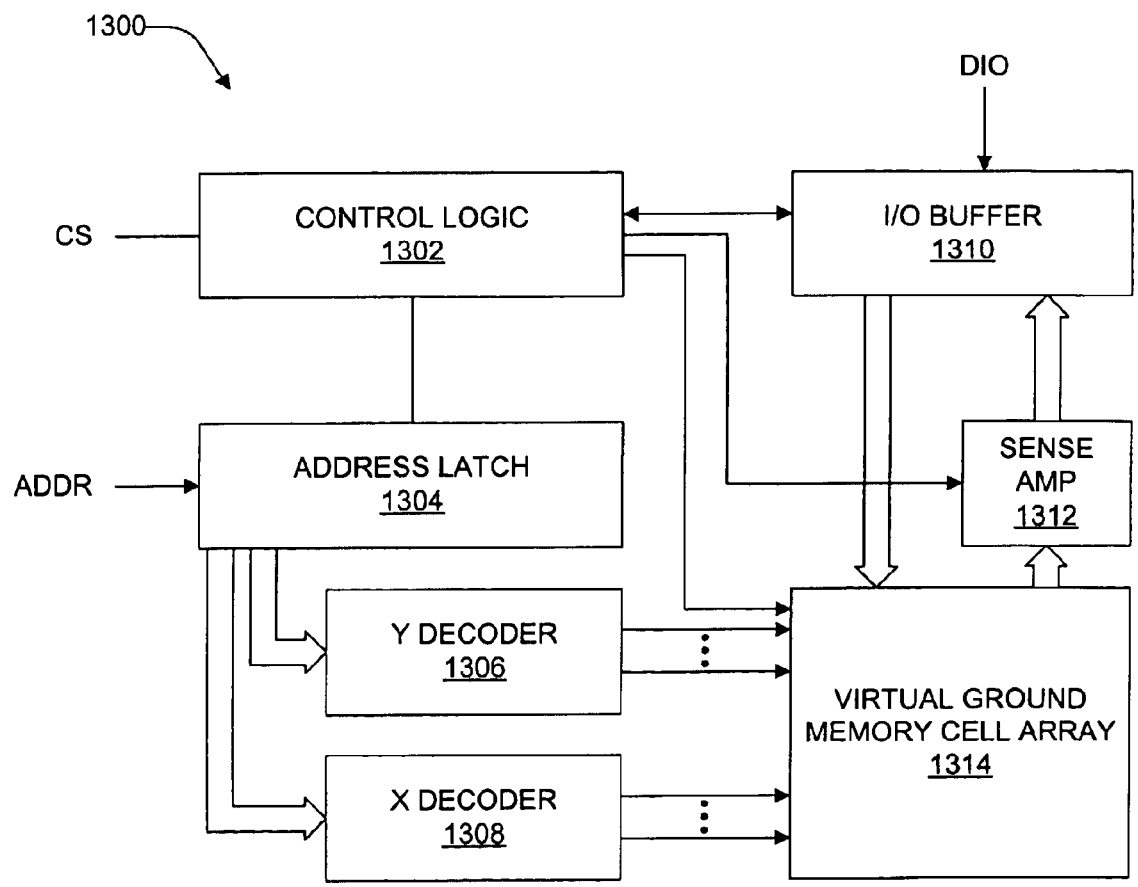
FIG. 16 is a schematic circuit diagram of a memory that uses a virtual ground memory array having single transistor memory cells like that of FIG. 3 and FIG. 10.

The floating gate memory array of FIG. 14 is used with various peripheral circuits to create a nonvolatile memory, including address and data buffers, row and column decoders, sense amplifiers, cell-disturb control circuits, high voltage load circuits, over erase protection circuits, programming timer circuits, and on-chip charge pumps. Such peripheral circuits are well known in the art. FIG. 16 shows an example of a complete memory that incorporates a virtual ground memory cell array 1314 and that includes control logic 1302, an address latch 1304, Y decoder 1306, X decoder 1308, an input/output buffer 1310, and a sense amplifier 1312.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. These and other variations and modifications of the embodiments disclosed herein may be made without departing from the scope and spirit of the invention.

What is claimed is:

1. A single-transistor virtual ground memory cell comprising:

a semiconductor substrate;

a control gate;

a floating gate disposed under the control gate and separated therefrom by a dielectric;

a first relatively lightly doped region disposed in the semiconductor substrate and comprising a source region;

a first relatively heavily doped region disposed in the semiconductor substrate and comprising a drain region; and a channel region disposed in the semiconductor substrate under the floating gate and separated therefrom by a tunnel dielectric, the channel region being disposed between the source region and the drain region;

wherein the first relatively lightly doped region is merged with a second relatively heavily doped region disposed in the substrate, and the first relatively heavily doped region is merged with a second relatively lightly doped region in the substrate;

wherein the merged first relatively lightly doped region and second relatively heavily doped region are not contiguous with an overlying thermal oxide in proximity to the source region; and wherein the merged first relatively heavily doped region and second relatively lightly doped region are not contiguous with an overlying thermal oxide in proximity to the drain region.

2. The memory cell of claim 1 wherein the first and second relatively heavily doped regions are elongated buried conductive lines.

3. The memory cell of claim 2 wherein the first and second relatively lightly doped regions are elongated buried lines, the first relatively lightly doped region being longitudinally merged with the second relatively heavily doped region, and the first relatively heavily doped region being longitudinally merged with the second relatively lightly doped region.

4. The memory cell of claim 3 wherein the channel comprises a halo implant merged with the drain region.

5. The memory cell of claim 1 wherein:

the source region forms a graded junction with the channel region; and the channel comprises a halo implant merged with the drain region.

6. The memory cell of claim 1 wherein a portion of the source region underlies the floating gate and is separated therefrom by a dielectric region that is thicker than the tunnel dielectric.

7. The memory cell of claim 6 wherein the dielectric region comprises a portion of the tunnel dielectric and a further dielectric.

8. The memory cell of claim 1 wherein:

the channel region is disposed in a p-well in the semiconductor substrate;

the first relatively lightly doped region is n-type; and the first relatively heavily doped region is n-type.

9. A semiconductor memory array block comprising:

a semiconductor substrate;

a plurality of row lines;

a plurality of column lines; and a plurality of single floating gate transistor memory cells respectively disposed along the row lines between cross points of the row and column lines, each of the transistors having asymmetrical source and drain regions of a first doping type and a channel therebetween of a second doping type different than the first doping type, the source region forming a junction with the channel for reduced channel hot electron generation and the drain region forming a junction with the channel for enhanced channel hot electron generation;

wherein each of the column lines comprises a relatively heavily doped continuous longitudinal region of the first doping type in the semiconductor substrate, sections of which form the drain regions of the transistors and are not contiguous with any overlying thermal oxide; and wherein each of the column lines further comprises a plurality of relatively lightly doped regions of the first doping type in the semiconductor substrate, the plurality of relatively lightly doped regions being merged with the relatively heavily doped continuous longitudinal region, forming the source regions of the transistors, and not being contiguous with any overlying thermal oxide.

10. The memory array block of claim 9 wherein:

each of the column lines further comprises a relatively lightly doped continuous longitudinal region of the first doping type in the semiconductor substrate;

in each of the column lines, the relatively lightly doped continuous longitudinal region thereof is longitudinally merged with the relatively heavily doped continuous longitudinal region thereof; and in each of the column lines, the plurality of relatively lightly doped regions thereof are sections of the relatively lightly doped continuous longitudinal region thereof.

11. The memory array block of claim 9 wherein the source region of each of the transistors forms a graded junction with the channel for reduced channel hot electron generation.

12. The memory array block of claim 11 wherein the drain region of each of the transistors forms a junction with a halo implant in the channel for enhanced channel hot electron generation.

13. The memory array block of claim 12 wherein:

each of the transistors further comprises a floating gate and a channel region;

the channel region being disposed in the semiconductor substrate under the floating gate and between the source region and the drain region, and separated from the floating gate by a tunnel dielectric; and the source region being separated from the floating gate by the tunnel dielectric and by an additional dielectric for reduced channel hot electron injection into the floating gate.

14. The memory array block of claim 9 wherein:

the channels of the memory cells are disposed in p-type regions of the semiconductor substrate;

the column lines are n-type; and the first relatively heavily doped region is n-type.

* * * * *